US006822979B2

(12) United States Patent
Daiber

(10) Patent No.: US 6,822,979 B2
(45) Date of Patent: Nov. 23, 2004

(54) EXTERNAL CAVITY LASER WITH CONTINUOUS TUNING OF GRID GENERATOR

(75) Inventor: Andrew Daiber, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/900,474

(22) Filed: Jul. 6, 2001

(65) Prior Publication Data

US 2003/0021303 A1 Jan. 30, 2003

(51) Int. Cl.[7] .................................................. H01S 3/10
(52) U.S. Cl. ......................................... 372/20; 372/18
(58) Field of Search ........................... 359/122; 372/20, 372/18

(56) References Cited

U.S. PATENT DOCUMENTS

| 3,967,211 A | 6/1976 | Itzkan et al. |
| 4,309,671 A | 1/1982 | Malyon |

(List continued on next page.)

FOREIGN PATENT DOCUMENTS

| EP | 0924628 | 8/1998 | |
| EP | 0 951 112 A2 | 10/1999 | |
| WO | WO 98/05105 | 2/1998 | |
| WO | WO 98/44424 | 10/1998 | |
| WO | WO 00/49689 A1 | 8/2000 | |
| WO | WO0049689 | * 8/2000 | ............... 359/122 |
| WO | WO 01/04999 A1 | 1/2001 | |
| WO | WO 01/08277 A1 | 2/2001 | |
| WO | WO 02/078137 A1 | 10/2002 | |
| WO | WO 03/005500 A2 | 1/2003 | |
| WO | WO 03/005501 A2 | 1/2003 | |
| WO | WO 03/005512 A2 | 1/2003 | |
| WO | PCT/US 02/21415 | 11/2003 | |

OTHER PUBLICATIONS

Favre et al.: 'External–Cavity Semiconductor Laser With 15 nm Continuous Tuning Range', Electronics Letters, Jun. 19, 1986.
Macleod, H. A. in *Thin Film Optical Filters* 2$^{nd}$ Edition, McGraw–Hill, 1989, pp 244–269, no month.
Mellis et al.: 'Miniature Packaged External–Cavity Semiconductor Laser With 50Ghz Continuous Electical Tuning Range', Electronics Letters, Apr. 22, 1988.
Rosenberg, K. P., et al., "Logarithmically Variable Infrared Etalon Filters," SPIE, vol. 2262/223, pp. 223–232, no year, no month.
Scobey M. and Stupik P., "Stable Ultra–Narrow Banpass Filters," SPIE, vol. 2262, pp. 37–46, no month, year.
Siegman A. E., "An Introduction to Lasers and Masers," McGraw–Hill, Inc., 1971.
Takashashi, H., Temperature Stability of Thin–Film Narrow–Bandpass Filters Produced by Ion–Assisted Deposition Applied Optics, vol. 34, No. 4, Feb. 1, 1995.

(List continued on next page.)

Primary Examiner—Paul Ip
Assistant Examiner—Hung T Vy
(74) Attorney, Agent, or Firm—Blakely, Sokoloff, Taylor & Zafman LLP

(57) ABSTRACT

A laser having a grid generator that is configured such that the grid transmission peaks can be changed or varied during laser operation. The grid generator is tunable between at least two different, selectable grid spacings. The laser may be of various configurations, and may be a tunable external cavity laser having a channel selector in the external cavity. The laser may further comprise a tuner or tuning assembly operatively coupled to the grid generator and configured to adjust the grid generator to the selectable communication grids.

21 Claims, 7 Drawing Sheets

U.S. PATENT DOCUMENTS

| | | | |
|---|---|---|---|
| 4,410,992 A | 10/1983 | Javan | |
| 4,460,977 A | 7/1984 | Shimada et al. | |
| 4,504,950 A | 3/1985 | AuYeung | |
| 4,560,246 A | 12/1985 | Cotter | |
| 4,583,227 A | 4/1986 | Kirkby | |
| 4,770,047 A | 9/1988 | Arditty et al. | |
| 4,839,614 A | 6/1989 | Hill et al. | |
| 4,843,233 A | 6/1989 | Jeunhomme | |
| 4,847,853 A | 7/1989 | Van Dijk | |
| 4,870,269 A | 9/1989 | Jeunhomme et al. | |
| 4,932,782 A | 6/1990 | Graindorge et al. | |
| 4,947,398 A | 8/1990 | Yasuda et al. | |
| 4,994,677 A | 2/1991 | Graindorge | |
| 5,028,395 A | 7/1991 | Sebille et al. | |
| 5,050,179 A | 9/1991 | Mooradian | |
| 5,058,124 A | 10/1991 | Cameron et al. | |
| 5,103,457 A | 4/1992 | Wallace et al. | |
| 5,115,677 A | 5/1992 | Martin et al. | |
| 5,124,993 A | 6/1992 | Braunlich et al. | |
| 5,141,316 A | 8/1992 | Lefevre et al. | |
| 5,163,063 A | 11/1992 | Yoshikawa et al. | |
| 5,172,185 A | 12/1992 | Leuchs et al. | |
| 5,181,078 A | 1/1993 | Lefevre et al. | |
| 5,181,214 A | 1/1993 | Berger et al. | |
| 5,185,643 A | 2/1993 | Vry et al. | |
| 5,218,610 A | 6/1993 | Dixon | |
| 5,225,930 A | 7/1993 | Land et al. | |
| 5,263,037 A | 11/1993 | Trutna, Jr. et al. | |
| 5,270,791 A | 12/1993 | Lefevre et al. | |
| 5,305,330 A | 4/1994 | Rieder et al. | |
| 5,319,668 A | 6/1994 | Luecke | |
| 5,321,717 A | 6/1994 | Adachi et al. | |
| 5,327,447 A | 7/1994 | Mooradian | |
| 5,331,651 A | 7/1994 | Becker et al. | |
| 5,347,527 A | 9/1994 | Favre et al. | |
| 5,349,439 A | 9/1994 | Graindorge et al. | |
| 5,349,440 A | 9/1994 | DeGroot | |
| 5,373,515 A | 12/1994 | Wakabayashi et al. | |
| 5,387,974 A | 2/1995 | Nakatani | |
| 5,412,474 A | 5/1995 | Reasenberg et al. | |
| 5,414,280 A | 5/1995 | Girmay | |
| 5,418,800 A | 5/1995 | Prior et al. | |
| 5,420,687 A | 5/1995 | Kachanov | |
| 5,428,700 A | 6/1995 | Hall | |
| 5,438,579 A | 8/1995 | Eda et al. | |
| 5,444,724 A | 8/1995 | Goto | |
| 5,450,202 A | 9/1995 | Tisue | |
| 5,473,625 A | 12/1995 | Hansen et al. | |
| 5,543,916 A | 8/1996 | Kachanov | |
| 5,583,638 A | 12/1996 | Cutler | |
| 5,594,744 A | 1/1997 | Lefevre et al. | |
| 5,606,439 A | 2/1997 | Wu | |
| 5,631,736 A | 5/1997 | Thiel et al. | |
| 5,651,018 A | 7/1997 | Mehuys et al. | |
| 5,673,129 A * | 9/1997 | Mizrahi | 359/124 |
| 5,712,704 A | 1/1998 | Martin et al. | |
| 5,719,674 A | 2/1998 | Martin et al. | |
| 5,737,109 A | 4/1998 | Goodwin | |
| 5,751,750 A | 5/1998 | Friede et al. | |
| 5,760,391 A | 6/1998 | Narendran | |
| 5,777,773 A | 7/1998 | Epworth et al. | |
| 5,802,085 A | 9/1998 | Lefevre et al. | |
| 5,812,716 A | 9/1998 | Ohishi | |
| 5,825,792 A | 10/1998 | Villeneuve et al. | |
| 5,848,092 A | 12/1998 | Mitsumoto et al. | |
| 5,862,162 A | 1/1999 | Maeda | |
| 5,872,881 A | 2/1999 | Rossi et al. | |
| 5,886,785 A | 3/1999 | Lefevre et al. | |
| 5,917,188 A | 6/1999 | Atkinson et al. | |
| 5,943,352 A | 8/1999 | Fee | |
| 5,946,331 A | 8/1999 | Amersfoort et al. | |
| 5,991,061 A | 11/1999 | Adams et al. | |
| 6,018,535 A * | 1/2000 | Maeda | 372/20 |
| 6,026,100 A | 2/2000 | Maeda | |
| 6,034,799 A * | 3/2000 | Hansen | 359/124 |
| 6,040,950 A | 3/2000 | Broome | |
| 6,043,883 A | 3/2000 | Leckel et al. | |
| 6,044,095 A | 3/2000 | Asano et al. | |
| 6,061,369 A | 5/2000 | Conradi | |
| 6,064,501 A | 5/2000 | Roberts et al. | |
| 6,081,539 A | 6/2000 | Mattori et al. | |
| 6,084,695 A | 7/2000 | Martin et al. | |
| 6,108,355 A * | 8/2000 | Zorabedian | 372/20 |
| 6,115,121 A | 9/2000 | Erskine | |
| 6,115,401 A | 9/2000 | Scobey et al. | |
| 6,181,717 B1 | 1/2001 | Kner et al. | |
| RE37,044 E | 2/2001 | Wu | |
| 6,192,058 B1 | 2/2001 | Abeles | |
| 6,205,159 B1 * | 3/2001 | Sesko et al. | 372/20 |
| 6,215,802 B1 | 4/2001 | Lunt | |
| 6,229,835 B1 | 5/2001 | Tomaru et al. | |
| 6,243,517 B1 | 6/2001 | Deacon | |
| 6,246,480 B1 | 6/2001 | O'Brien | |
| 6,249,364 B1 | 6/2001 | Martin et al. | |
| 6,249,365 B1 * | 6/2001 | Mizrahi et al. | 359/130 |
| 6,252,718 B1 | 6/2001 | Lefevre | |
| 6,259,712 B1 | 7/2001 | Decain et al. | |
| 6,282,215 B1 * | 8/2001 | Zorabedian et al. | 372/20 |
| 6,301,274 B1 | 10/2001 | Tayebati et al. | |
| 6,301,280 B1 | 10/2001 | Broutin et al. | |
| 6,304,586 B1 | 10/2001 | Pease et al. | |
| 6,314,115 B1 | 11/2001 | Delfyett et al. | |
| 6,321,011 B2 | 11/2001 | Deacon | |
| 6,324,204 B1 | 11/2001 | Deacon | |
| 6,330,253 B1 | 12/2001 | Tuganov et al. | |
| 6,331,892 B1 | 12/2001 | Green | |
| 6,337,660 B1 * | 1/2002 | Esman et al. | 342/375 |
| 6,366,592 B1 * | 4/2002 | Flanders | 372/18 |
| 6,366,689 B1 * | 4/2002 | Rao et al. | 382/145 |
| 6,404,538 B1 | 6/2002 | Chen et al. | |
| 6,441,933 B1 * | 8/2002 | Jang | 359/124 |
| 6,463,085 B1 | 10/2002 | Tayebati | |
| 6,526,071 B1 * | 2/2003 | Zorabedian et al. | 372/20 |
| 6,532,091 B1 * | 3/2003 | Miyazaki et al. | 359/176 |
| 2002/0048297 A1 | 4/2002 | Irie et al. | |
| 2002/0126345 A1 * | 9/2002 | Green et al. | 359/122 |
| 2002/0136104 A1 | 9/2002 | Daiber | |

OTHER PUBLICATIONS

Yoder, *Optical Instrument Structural Design*, pp. 612–619, no month, year.

Zhang, X.X., "An Interference Based External Cavity Laser For Dense Wavelength Division Multiplexing Applications," Corning OCA Corp., pp. 103–108, no month, year.

Ketelsen, L. J. P., "Simple Technique for Measuring Cavity Loss in Semiconductor Laser," *Electronics Letters*, (Aug. 18, 1994), vol. 30, No. 17, pp. 1422–1424.

Shtengel, G. E., et al., "Internal Optical Loss Measurements in 1.3um InGaAsP Lasers," *Electronic Letters*, (Jul. 6, 1995), vol. 31, No. 14, pp. 1157–1159.

\* cited by examiner

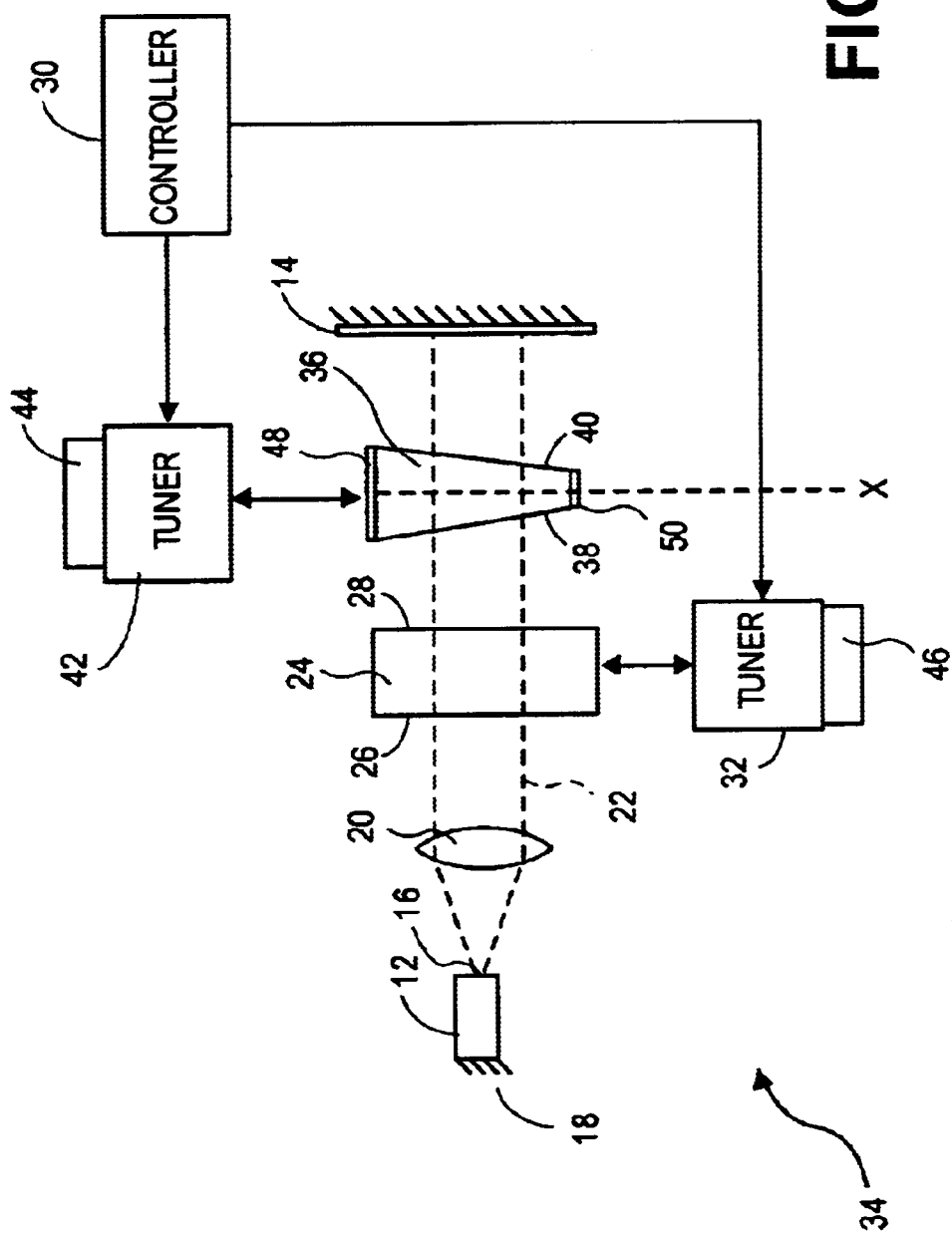

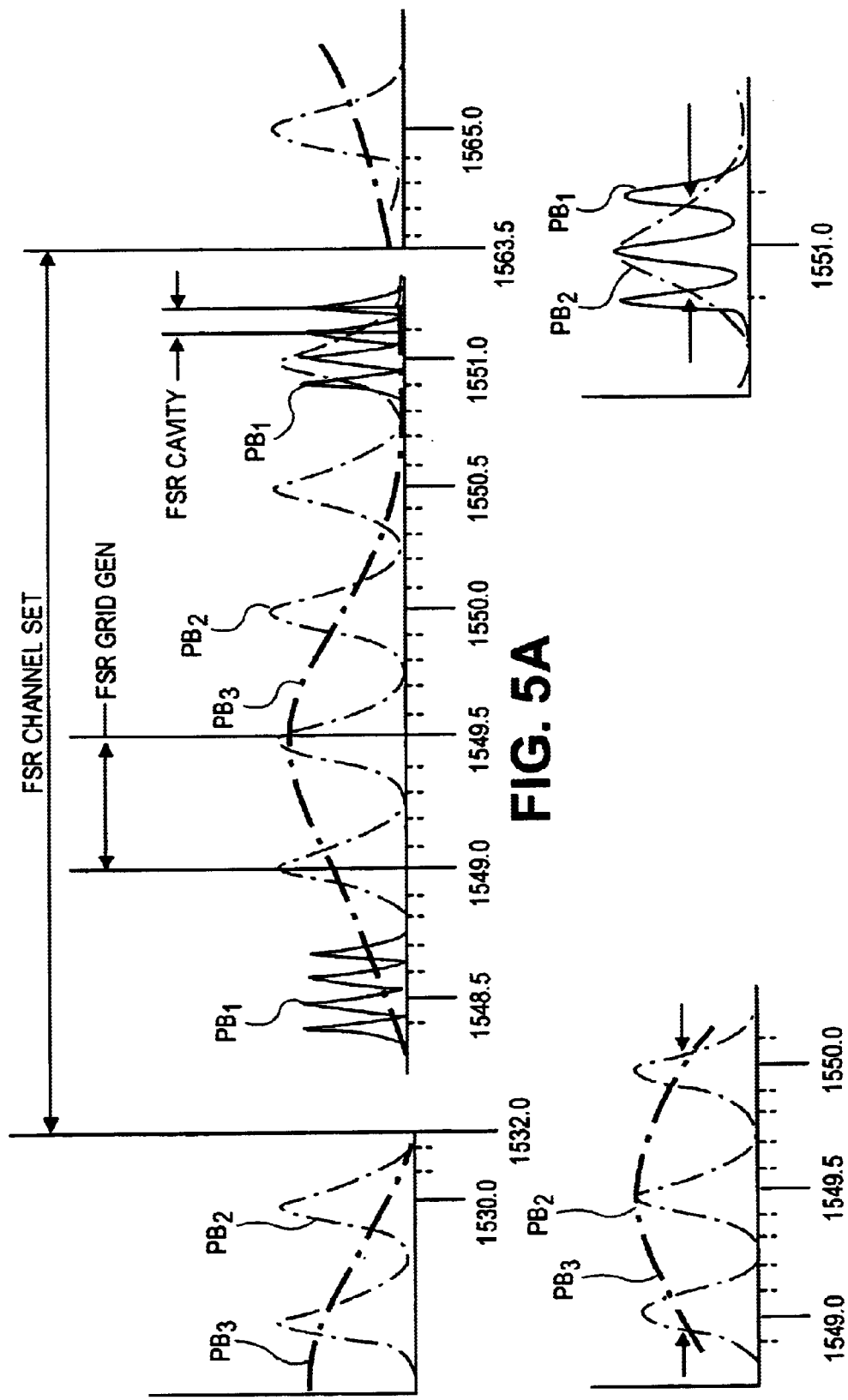

EXTERNAL CAVITY LASER WITH CONTINUOUS TUNING OF GRID GENERATOR

BACKGROUND OF THE INVENTION

Telecommunication transmitter lasers are used in dense wavelength division multiplexing (DWDM) optical communication systems wherein multiple separate data streams exist concurrently in a single optical fiber, with modulation of each data stream occurring on a different channel. Each data stream is modulated onto the output beam of a corresponding transmitter laser operating at a specific channel wavelength, and the modulated outputs from the semiconductor lasers are combined onto a single fiber for transmission in their respective channels. A popular set by the International Telecommunications Union (ITU) presently requires channel separations of approximately 0.4 nanometers, or about 50 GHz. This channel separation allows at least 128 channels to be carried by a single fiber within the bandwidth range of currently available fibers and fiber amplifiers.

Such telecommunication transmitter lasers typically use a grid generator that defines multiple, selectable transmission wavelengths that correspond to the ITU grid wavelengths or other selected grid. The grid generator used is typically a Fabry-Perot interference filter having transmission maxima that are evenly spaced apart in frequency. Through careful manufacturing of the grid etalon and alignment of the grid etalon with respect to the momentum axis of the optical beam passing therethrough, the spacing of the transmission peaks defined by the grid etalon can be aligned with a selected wavelength grid, such as a grid defined by the ITU standards. A thermoelectric controller may be coupled to the grid etalon, and careful thermal control of the grid etalon during laser operation provides a temperature lock for the grid etalon so that variation in the grid transmission peaks does not occur due to thermal fluctuations.

As optical communication networks evolve towards re-configurable architectures, increasingly sophisticated telecommunication transmitter lasers have become necessary. In particular, a need has arisen for a telecommunication transmitter laser that provides active tuning or adjustment of grid transmission peaks during laser operation to allow selection of different communication grids.

SUMMARY OF THE INVENTION

The invention provides a laser apparatus, as well as systems and methods, for active tuning of a grid generator during laser operation to provide selected grid transmission channel spacing. The apparatus of the invention, in its broadest sense, is a laser having a grid generator that is configured such that the grid transmission peaks can be changed or varied during laser operation to allow selection of different communication grids. The grid generator is tunable over at least a small range about a nominal grid setting. More specifically, the grid generator may be tunable over a range as great as, or exceeding its initial or nominal grid setting, such that any desired wavelength grid may be selected by appropriate tuning or adjustment of the grid generator. The laser may be of various configurations, and may be a tunable external cavity laser having a channel selector in the external cavity. The laser may further comprise a tuner or tuning assembly operatively coupled to the grid generator and configured to adjust the grid generator to the selectable communication grids.

The laser may further comprise a gain medium having a first and second output facets, with the gain medium emitting a coherent beam from the first output facet along an optical path to an end mirror in the optical path, such that the end mirror and the second output facet define an external cavity. A channel selector may be positioned in association with the external cavity, and operatively coupled to a channel selector tuner configured to tune the channel selector in the optical path to selectable transmission wavelengths corresponding to transmission bands in the selectable communication grids. The laser may further comprise an external cavity optical path length tuner operatively coupled to the external cavity and configured to adjust the optical path length for the external cavity.

The grid generator may be in the form of a grid etalon that defines a plurality of wavelength passbands or transmission bands that are spaced apart according to the free spectral range (FSR) of the grid etalon. The spacing of the passbands may correspond to, for example, the ITU grid spacing. In one embodiment of the laser, the grid generator tuner is configured to rotatably adjust the grid etalon in the optical path. The grid generator tuning assembly may be operatively coupled to the grid etalon to tune the grid by rotating or tilting the grid etalon to change the grid etalon's optical thickness or path length, thus changing the selected communication grid spacing. The grid generator tuning assembly may further comprise a controller having stored adjustment data for different selectable grids, with the grid etalon being adjusted to provide the selected wavelength grid.

In other embodiments the grid generator tuning assembly may alternatively, or additionally, tune the grid etalon by thermal control with a thermoelectric controller (TEC) operatively coupled to the grid etalon and configured to adjust the optical thickness of the grid etalon by selective heating or cooling to provide a selected grid spacing. Heating or cooling affects the size of a spacer controlling the etalon gap. In other embodiments, the etalon may comprise a non-vacuum gap filled with a material, the heating or cooling of which affects a change in the optical path length across the etalon gap. In still other embodiments, the etalon may comprise an electro-optic material and have an effective optical path length that is adjustable by application of voltage across the electro-optic material.

Various other tuning mechanisms are usable for adjustment of a grid etalon or grid generator in accordance with the invention. Such tuning may comprise, for example, pressure-tuning of a gas-filled etalon, piezoelectric tuning of the etalon gap, optical tuning via non-linear optical effects, voltage tuning of an electro-optic etalon material, micro-positioning using a MEMS (micro-electro-mechanical system) actuator, or other form of tuning.

Control of the grid generator may be carried out according to grid etalon adjustment parameters stored in a look-up table by the grid generator controller. The grid etalon adjustment parameters may comprise a list of temperatures for select wavelengths and a rule for interpolating the temperatures for non-listed wavelengths. Additional rules may be provided for adjusting the temperatures based on ambient temperature or knowledge of the system state. For temperature control of the grid etalon, the temperature may be achieved by placing a temperature sensor, for example a thermistor, in the region where heat is pumped by the TEC. The temperature sensor is preferably, but not necessarily, near the location of the grid to be controlled. A control mechanism can then adjust the current into the TEC to achieve the desired temperature at the thermistor. The control algorithm may comprise a PID loop. The control algorithm may alternatively comprise a state estimator and control laws for controlling the output states. The optical path length across the etalon is an output state, and the input states comprise the temperature sensor in the region where heat is pumped, ambient temperature sensors, and other sensors.

The laser may further comprise a detector positioned and configured to monitor laser output and provide a detector output indicative of the wavelength location of a transmission peak or peaks of the grid etalon. Error signals may be derived from the detector output and used by the controller to adjust laser wavelength with respect to the grid transmission peaks in order to zero out or null and error signal. The error signal may be obtained by providing a wavelength modulation to the grid generator transmission spectrum to allow detection of the transmission peaks, by wavelength modulating a laser transmitted through the grid generator, or by setting the wavelength of a laser away from the transmission peak and balancing the reflected and transmitted portions of the beam.

In some embodiments, the grid generator may be located within the laser cavity, while in other embodiments the grid generator may be external from the laser cavity, and some or all of the light exiting either the output end or back end of the laser may be directed into the grid generator. In certain embodiments, the detector may comprise a voltage detector configured to monitor voltage modulation across the gain medium 12. In other embodiments, the detector may comprise a photodetector configured to monitor optical output from the laser.

The method of the invention, in its broadest sense, comprises providing a laser having a grid generator, and adjusting the grid generator to a selected grid spacing. The grid generator should be tunable or adjustable over at least a small range about a nominal grid setting. The adjusting of the grid generator may comprise tuning the grid generator over a range as great as or exceeding its initial or nominal grid setting. With this range of adjustment, any desired wavelength grid may be selected by appropriate tuning or adjustment of the grid generator. The adjustment may be carried out by any mechanism, i.e., thermal adjustment, rotational adjustment, electro-optic, or other, or combinations of the various adjustment mechanisms. The adjusting or tuning of the grid generator can be carried out by a controller according to stored adjustment data for different selectable grids. The grid generator can alternatively, or additionally, be tuned according to an error signal derived from a detector positioned and configured to sense laser output.

In one embodiment, the method of the invention is a method for generating a tunable coherent optical output comprising providing an external cavity laser having a gain medium with first and second output facets and emitting a coherent beam from the first output facet along an optical path to an end mirror, positioning a grid generator in association with the optical path; and tuning the grid generator to a selected grid spacing. The tunable grid generator may comprise a grid etalon, and the adjusting may comprise positionally or thermally adjusting the grid etalon. The method may further comprise tuning a channel selector positioned in the optical path in the external cavity. The method may additionally comprise adjusting the optical path length of the external cavity defined by the end mirror and second output facet.

There are numerous instances in which active tuning or adjustment of the transmission peaks of the communication grid are useful during laser operation. For example, active grid tuning allows the spacing of transmission channels to be continually optimized to achieve maximum capacity at a given bit error rate (BER) as limited by inter-channel crosstalk.

The invention also provides for convenient and economical to way to correct for variations in other optical components in a given transmission channel, such as a narrow band wavelength filter, by adjusting the communication grid to conform to the wavelength filter (as opposed to replacing the wavelength filter). Active adjustment of a grid generator also allows for correction of errors that may have been introduced during manufacture of the grid generator itself, which would otherwise prevent correspondence with the intended grid spacing. Such errors may include, for example, etalon thickness, angular placement or positioning with respect to the beam, and dispersion of optical thickness with respect to wavelength.

The invention further allows a frequency modulation or dither to be introduced to the grid transmission peaks that is usable to provide in-situ optimization of cross-talk, filter transmission or other system parameters. The use of a frequency modulation in this manner allows development of error signals that can be used in the adjustment or tuning of the grid etalon.

The invention further allows a single grid generator to essentially "mimic" or reproduce any communication grid provided that the range of adjustability of the grid generator is great enough. Thus, for example, a grid generator with a spacing set at 50 GHz initially could be tuned to 25 GHz, 33 GHz or other grid spacing.

BRIEF DESCRIPTIONS OF THE DRAWINGS

FIG. 4 is a schematic diagram of an alternative embodiment external cavity laser in accordance with the invention.

FIGS. 5A–5C are graphical illustrations of passband characteristics of the external cavity laser with respect to FIG. 1 for the wedge etalon, grid etalon and external cavity with respect to a selected channel in a wavelength grid.

DETAILED DESCRIPTION

Referring more specifically to the drawings, for illustrative purposes the present invention is embodied in the apparatus shown in FIG. 1 through FIG. 7. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also to be understood that the terminology used herein is for the purpose of describing particular embodiments only, and is not intended to be limiting, since the scope of the present invention will be limited only by the appended claims.

Figure 1:
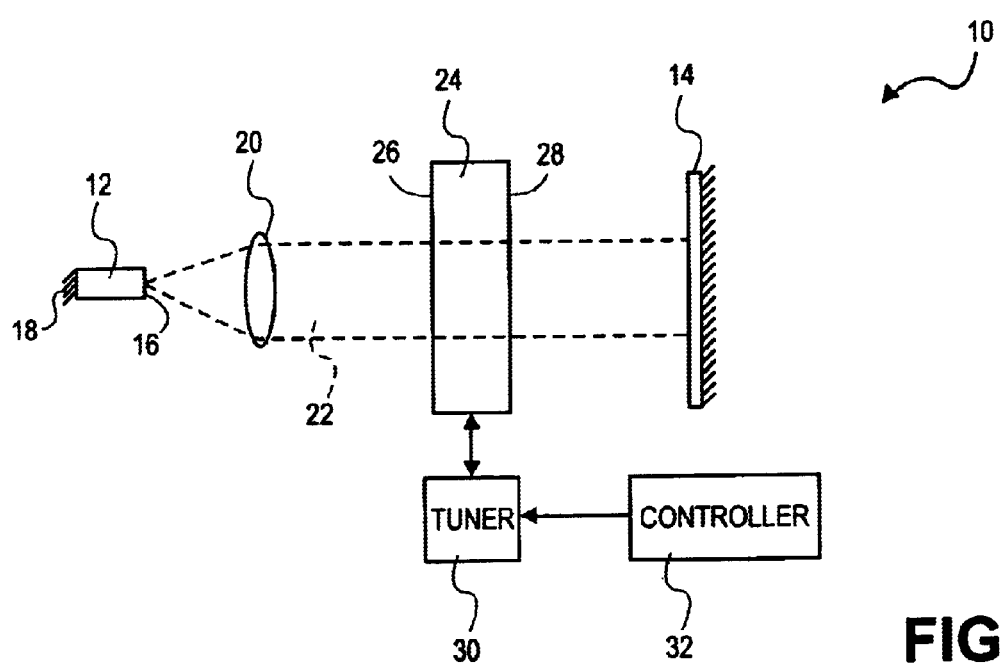
FIG. 1 is a schematic diagram of an external cavity laser apparatus with a tunable grid generator in accordance with the invention.

Referring now to FIG. 1, there is shown external cavity laser apparatus 10 in accordance with the invention. The apparatus 10 includes a gain medium 12 and an end or external reflective element or end mirror 14. Gain medium 12 may comprise a conventional Fabry-Perot diode emitter chip and has an anti-reflection (AR) coated front output facet 16 and a partially reflective rear output facet 18. The external laser cavity is defined or delineated by rear facet 18 and end mirror 14. Gain medium 12 emits a coherent beam from front facet 16 that is collimated by lens 20 and directed along an optical path 22 that is co-linear with the optical axis of the external cavity. Front and rear facets 16, 18 of gain medium 12 are aligned with the optical axis of the external cavity as well. Conventional output coupler optics (not shown) are associated with rear facet 18 for coupling the output of external cavity laser 10 into an optical fiber (also not shown).

The external cavity laser 10 includes a grid generator element, which is shown in FIG. 1 as a grid etalon 26 positioned in optical path 22 between gain medium 12 and end mirror 14. Grid etalon 24 has parallel reflective faces 26, 28, and operates as an interference filter, with the refractive index of grid etalon 24 and the optical thickness of grid etalon 24 as defined by the spacing of faces 26, 28 giving rise to a multiplicity of maxima and minima within the communication band at wavelengths which coincide, or, considering dispersion of the refractive index and manufacturing tolerances, nearly coincide with the center wavelengths of a selected wavelength grid which may comprise, for example, the ITU (International Telecommunications Union) grid. Grid etalon 24 has a free spectral range (FSR) which corresponds to the spacing between the grid lines of the a selected communication grid, and the grid etalon 24 thus operates to provide a plurality of passbands or transmission bands centered on each of the gridlines of the wavelength grid. Grid etalon 24 has a finesse (free spectral range divided by full width half maximum or FWHM) that suppresses neighboring modes of the external cavity laser between each channel of the wavelength grid.

Grid etalon 24 is operatively coupled to a tuner element 30 that is configured to tune grid etalon 24 such that multiple selectable communication grids may be defined by grid etalon. Grid etalon 24 may be a parallel plate solid, liquid or gas spaced etalon, and may be tuned by precise dimensioning of the optical thickness between faces 26, 28 by thermal expansion and contraction via temperature control and/or by tilting grid etalon 26 to vary the optical thickness between faces 26, 28. Grid etalon 24 may be made of an electro-optic material such as lithium niobate that has a voltage-dependent refractive index such that the effective optical thickness of grid etalon 24 (and the resulting grid spacing) is tunable by selective application of voltage by tuner 30 across faces 26, 28 using transparent electrodes (not shown) of indium-tin-oxide (ITO) or other transparent conductive material.

Grid etalon tuner 30 is operatively coupled to a controller 32. Controller 32 includes a data processor and a memory (not shown) wherein are stored tuning adjustment parameters for grid etalon 24 which correspond to multiple selectable communication grids. Thus, during operation of the external cavity laser 10, controller 32 may signal tuner 30 to adjust or tune grid etalon 24 to change from one selectable communication grid to another according to stored adjustment parameters. For example, where grid etalon 24 is tuned by tilting or pivoting, the look-up table may include multiple rotational position parameters for grid etalon 24 which correspond to different selectable grid spacings. Adjustment of grid etalon 24 by controller 32 may also be carried out according to error signals derived from a detector (not shown), as described further below.

The relative scale and distances between the various elements of external cavity laser 10 as shown in FIG. 1 are not necessarily shown to scale and have been exaggerated for reason of clarity. External cavity laser 10 may include additional components (not shown), such as focusing and collimating components, and polarizing optics configured to remove spurious feedback associated with the various components of external cavity laser 10. The laser 10 may additionally include a channel selector as described further below.

Figure 2:
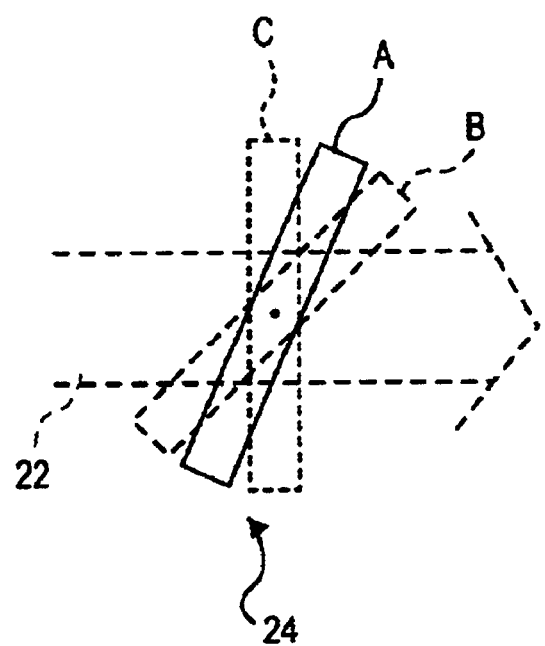
FIG. 2 is a schematic illustration of three different positions for a grid etalon corresponding to three selectable communication grids.
Figure 3:
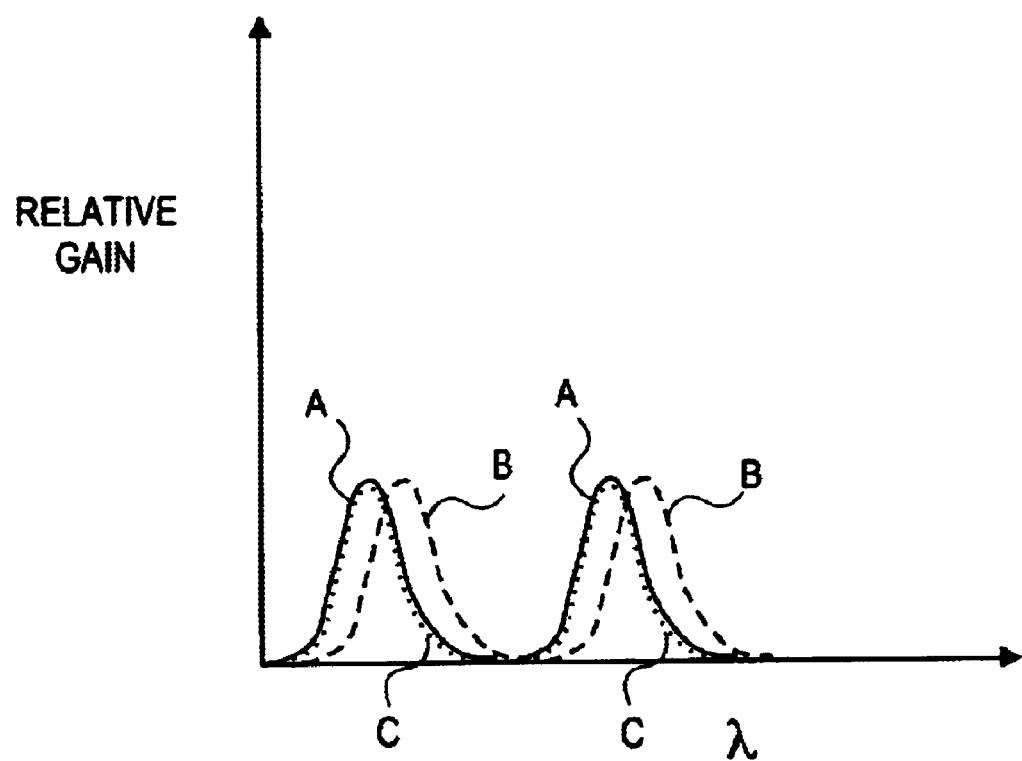
FIG. 3 is a graphical illustration of the three selectable communication grids corresponding to the grid etalon positions of FIG. 2.

Referring to FIG. 2 and FIG. 3 as well as FIG. 1, the tuning of grid etalon 24 to provide a selected communication grid is illustrated in terms of pivotal adjustment of grid etalon 24. FIG. 2 illustrates three rotational positions for grid etalon 24 positioned in optical path 22, with position A shown in solid line, position B shown as a dashed line, and position C as a dotted line. The three positions A–C are achieved by rotational positioning of grid etalon 24. Position B (dashed line) presents the greatest optical thickness to optical path, while position C (dotted line) presents the shortest optical path, and position A (solid line) results in a grid etalon optical thickness that is intermediate between positions B and C.

Positioning of grid etalon 24 in position A as shown in FIG. 2 results in the communication grid A shown in a solid line in FIG. 3, shown graphically as relative gain (vertical axis) versus wavelength (horizontal axis). Communication grid A has a series of periodic spaced apart maxima and minima corresponding to the free spectral range (FSR) defined by the optical thickness of etalon 24 in position A. Tuning of grid etalon 24 to position B as shown in FIG. 2 will result in the communication grid B shown as a dashed line in FIG. 3. Communication grid B is shifted with respect to communication grid A by an amount corresponding to the change in optical thickness. Tuning of grid etalon 24 to position C as shown in FIG. 2 will result in the communication grid C shown as a dotted line in FIG. 3. Communication grid C (dotted line) has returned the communication grid to substantially correspond with communication grid A, such that the solid line of grid A and dotted line of grid C are shown as superimposed. Communication grid C differs from communication grid A, however, in that there is precisely one additional peak between the overlapped peak and zero reciprocal wavelength.

Selection of the different communication grids A, B, C during operation of external cavity laser 10 may be desirable for a variety of reasons. For example, different corporate local area networks may be configured for telecommunication using different, proprietary wavelength grids with different transmission channels. The invention allows the laser 10 to be switched from transmission according to one such grid to a different grid. In other instances, where distance of range of signal transmission is increased or decreased, it may be desirable to re-configure the communication grid to optimize the grid spacing for the intended distance.

Referring now to FIG. 4, there is shown another embodiment external cavity laser 34, wherein like reference numbers denote like parts. The laser 34 includes a channel selector, which is shown in FIG. 4 as a wedge etalon 36.

Wedge etalon 36 acts as an interference filter, with non-parallel reflective faces 38, 40 providing a tapered shape. Wedge etalon 36 as shown in FIG. 4 is only one channel selector which may be used in accordance with the invention in an external cavity laser, and wedge etalon 36 may alternatively comprise a tapered transparent substrate, a tapered air gap between the reflective surfaces of adjacent transparent substrates, a graded thin film interference filter, a grating, an electro-optic tuner, a vernier tuning device, or other channel selector device. The use of an air gap wedge etalon for channel selection is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter as a channel selector is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The passbands defined by wedge etalon 36 are substantially broader than the passbands defined by grid etalon 24, with the broader passbands of the wedge etalon 36 having a periodicity substantially corresponding to the separation between the shortest and longest wavelength channels defined by the grid etalon 24. In other words, the free spectral range of the wedge etalon 36 corresponds to the full wavelength range of the wavelength grid defined by grid etalon 24. The wedge etalon 36 has a finesse that suppresses channels adjacent to a particular selected channel.

The wedge etalon 36 is used to select between multiple communication channels by changing the optical thickness between faces 38, 40 of wedge etalon 36. This is achieved by translating or driving wedge etalon 36 along axis x, which is substantially parallel to the direction of taper of wedge etalon 36 and substantially perpendicular to optical path 22 and the optical axis of external cavity laser 34. Each of the passbands defined by the wedge etalon 36 supports a selectable channel, and as the wedge etalon 36 is advanced or translated into optical path 22, the beam traveling along optical path 22 passes through increasingly thicker portions of wedge etalon 36 which support constructive interference between opposing faces 38, 40 at longer wavelength channels. As wedge etalon 36 is withdrawn from optical path 22, the beam will experience increasingly thinner portions of wedge etalon 36 and expose passbands to the optical path 22 that support correspondingly shorter wavelength channels. The free spectral range of wedge etalon 36 corresponds to the complete wavelength range of grid etalon 24 as noted above, so that a single loss minimum within the communications band can be tuned across the wavelength grid. The combined feedback to gain medium 12 from the grid etalon 24 and wedge etalon 36 support lasing at the center wavelength of a selected channel. Across the tuning range, the free spectral range of the wedge etalon 36 is broader than that of grid etalon 24.

Wedge etalon 36 is positionally tuned via a tuning assembly which comprises a drive element or tuner 42 structured and configured to adjustably position wedge etalon 36 according to selected channels, which in turn are defined by the communication grid resulting from the positioning of grid etalon 24 as described above. Tuner 42 may comprise a stepper motor together with suitable hardware for precision translation of wedge etalon 36. Tuner 42 may alternatively comprise various types of actuators, including, but not limited to, DC servomotors, solenoids, voice coil actuators, piezoelectric actuators, ultrasonic drivers, shape memory devices, and like tuning devices. Where a different type of channel selector other than wedge etalon 26 is used with the invention, wavelength tuner 42 will accordingly be configured to tune the channel selector.

Wedge etalon tuner 42 is operatively coupled to controller 30, which provides signals to control the positioning of wedge etalon 36 by tuner 42. Controller 30 may include a data processor and memory (not shown) wherein are stored lookup tables of positional information for wedge etalon 36 that correspond to selectable channel wavelengths. Wedge etalon 36 is shown as controlled by the same controller 30 used for control of grid etalon 24 as described above. A separate controller may be used for wedge etalon 36, however.

When external cavity laser 34 is tuned to a different communication channel defined by grid etalon 24, controller 30 signals tuner 42 according to positional data in the look up table, and tuner 42 translates or otherwise adjusts wedge etalon 36 to the correct position wherein the optical thickness of the portion of the wedge etalon 36 positioned in optical path 22 provides constructive interference which supports the selected channel. A linear encoder 44 may be used in association with wedge etalon 36 and tuner 42 to ensure correct positioning of wedge etalon 36 by tuner 42. An encoder 46 may also be included in association with the grid etalon tuner 32 to ensure correct positioning of grid etalon 24 by tuner 32.

Wedge etalon 36 may include opaque regions 48, 50 at its ends that are optically detectable and which serve to verify the position of wedge etalon 36 when it has been positionally tuned to its longest or shortest channel wavelength. Opaque regions 48, 50 provide an additional encoder mechanism usable in the positional tuning of wedge etalon 36. When wedge etalon 36 is moved into a position such that one of opaque regions 48, 50 enters optical path 22, the opaque region 48, 50 will block or attenuate the beam along optical path. This attenuation of light is detectable, as described further below, either optically or by monitoring voltage modulation across gain medium 12. Since the location of opaque regions 48, 50 on wedge etalon 36 can be determined with precision, controller 30 can anticipate when an opaque region 48, 50 will enter optical path 22. Appearance of an opaque region 48, 50 in optical path 22 at a point other than predicted will indicate an encoder error, and the controller 30 can make an appropriate correction based on the detected presence of an opaque region 48, 50 in optical path 22. Additional opaque regions (not shown) may be included elsewhere on wedge etalon 36.

The relative size, shape and distances between the various optical components of external cavity laser 34 are in some instances exaggerated for clarity and are not necessarily shown to scale. External cavity laser 34 may include additional components (not shown), such as focusing and collimating components, and polarizing optics configured to remove spurious feedback associated with the various components of external cavity laser 34.

The passband relationship of the grid etalon 24, wedge etalon 36 and the external cavity defined by rear facet 18 and end mirror 14 of external cavity laser 34 are illustrated graphically in FIG. 5A through FIG. 5C, which show external cavity passbands PB1, grid etalon passbands PB2, and wedge etalon passbands PB3. Relative gain is shown on the vertical axis and wavelength on the horizontal axis. The grid etalon passbands PB2 may correspond, for example, to the passbands defined by one of the communication grids shown in FIG. 3. FIGS. 5A–5C show an exemplary grid spacing of 0.5 nanometers (nm).

As can be seen in FIGS. 5A–5C, the free spectral range of the wedge etalon 36 ($FSR_{Channel\ Sel}$) is greater than the free spectral range of the grid etalon 24 ($FSR_{Grid\ Gen}$), which in turn is greater than the free spectral range of the external cavity ($FSR_{Cavity}$). The band pass peaks PB1 of the external cavity periodically align with the center wavelengths of passbands PB2 defined by the wavelength grid of grid etalon 24. There is one passband peak PB3 from the wedge etalon 36 that extends over all of the passbands PB2 of the wavelength grid. In the specific example shown in FIGS. 5A–5C, the wavelength grid defined by grid etalon 24 extends over sixty four channels spaced apart by one half nanometer (nm) or 62 GHz, with the shortest wavelength channel at 1532 nm, and the longest wavelength channel at 1563.5 nm. This spacing may be tuned in accordance with the invention by tuning grid etalon 24 as described above.

The finesse of grid etalon 24 and wedge etalon 36 determine the attenuation of neighboring modes or channels. As noted above, finesse is equal to the free spectral range over the full width half maximum, or finesse=FSR/FWHM. The width for a grid etalon passband PB2 at half maximum is shown in FIG. 5B, and the width for a wedge etalon passband PB3 at half maximum is shown in FIG. 5C. The positioning of grid etalon 24 and wedge etalon 36 within the external cavity improves side mode suppression.

Figure 6A:
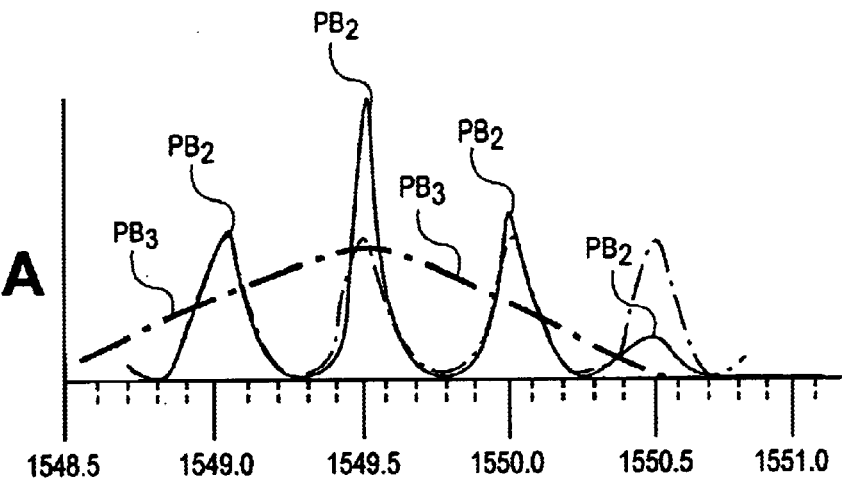
FIGS. 6A–6C are graphical illustrations of gain response to tuning of the external cavity laser of FIG. 1 for a plurality of channels in a wavelength grid.

The tuning of the band pass PB3 of wedge etalon 26 between a channel centered at 1549.5 nm and an adjacent channel at 1550 nm is illustrated graphically in FIGS. 6A–3C, wherein the selection of a channel generated by grid etalon 24 and the attenuation of adjacent channels or modes is shown. The external cavity passbands PB1 shown in FIGS. 5A–5C are omitted from FIGS. 6A–6C for clarity. The grid etalon 24 selects periodic longitudinal modes of the external cavity corresponding to the grid channel spacing while rejecting neighboring modes. The wedge etalon 36 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 6A, the wedge etalon passband PB3 is centered with respect to the grid channel at 1549.5 nm. The relative gain associated with passband PB2 at 1549.5 nm is high, while the relative gain levels associated with adjacent passbands PB2 at 1549.0 nm and 1550.0 nm are suppressed relative to the selected 1549.5 nm channel. The gain associated with passbands PB2 at 1550.5 nm and 1548.5 nm is further suppressed. The dashed line indicates the relative gain for passbands PB2 without suppression by wedge etalon 26.

Figure 6B:
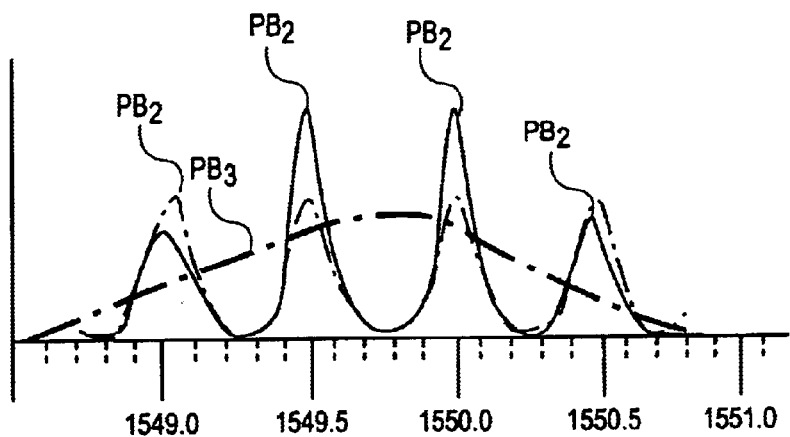

FIG. 6B shows the wedge etalon passband PB at a position in between the channels at 1549.5 nm and 1550.0 nm, as occurs during channel switching. The relative gain associated with passbands PB2 at 1549.5 nm and 1550.0 are both high, with neither channel suppressed. The relative gain levels associated with passbands PB2 at 1549.0 nm and 1550.5 nm are suppressed relative to the 1549.5 nm and 1550.0 nm channels. The dashed line indicates the relative gain for passbands PB2 without suppression by wedge etalon 26.

Figure 6C:
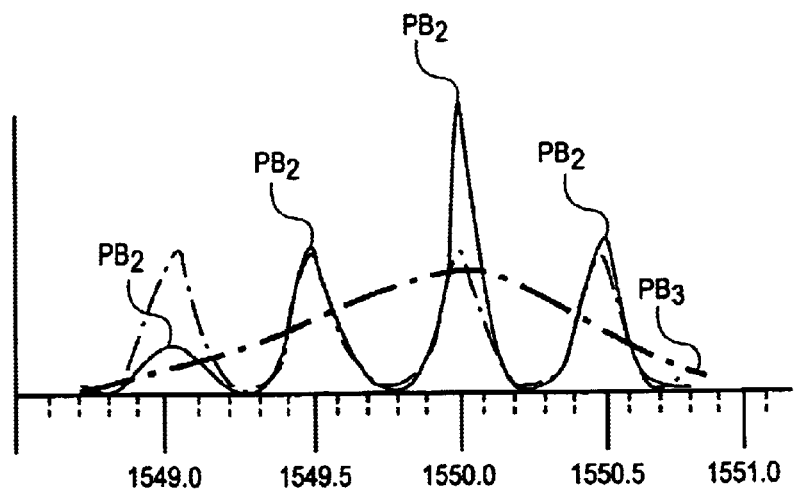

FIG. 6C shows the wedge etalon passband PB3 centered with respect to the grid channel at 1550.0 nm, with the relative gain associated with the passband PB2 at 1550.0 nm being high, while the relative gain levels associated with adjacent passbands PB2 at 1549.5 nm and 1550.5 nm are suppressed relative to the selected 1550.0 nm channel, and the gain associated with passbands PB2 at 1551.0 nm and 1549.0 nm is further suppressed. Again, the dashed line indicates the relative gain for passbands PB2 without suppression by wedge etalon 36.

The 0.5 nm grid spacing shown in FIG. 5 and FIG. 6 represents only one communication grid usable with the external cavity laser 34. Grid etalon 24 may be tuned by positional, thermal, acoustic, optical, pressure and/or voltage control mechanisms or other control mechanisms, as described above, to tune the communication grid. A 0.25 nm grid spacing can be achieved from the nominally 0.5 nm grid shown by tuning the communication grid between two positions separated by 0.25 nm. The grid requires retuning whenever a transition from an even channel to an odd channel occurs. The tuning of external cavity laser 34 with wedge etalon 36 at different selected grid spacings is carried out in generally the same manner as described above.

Figure 7:
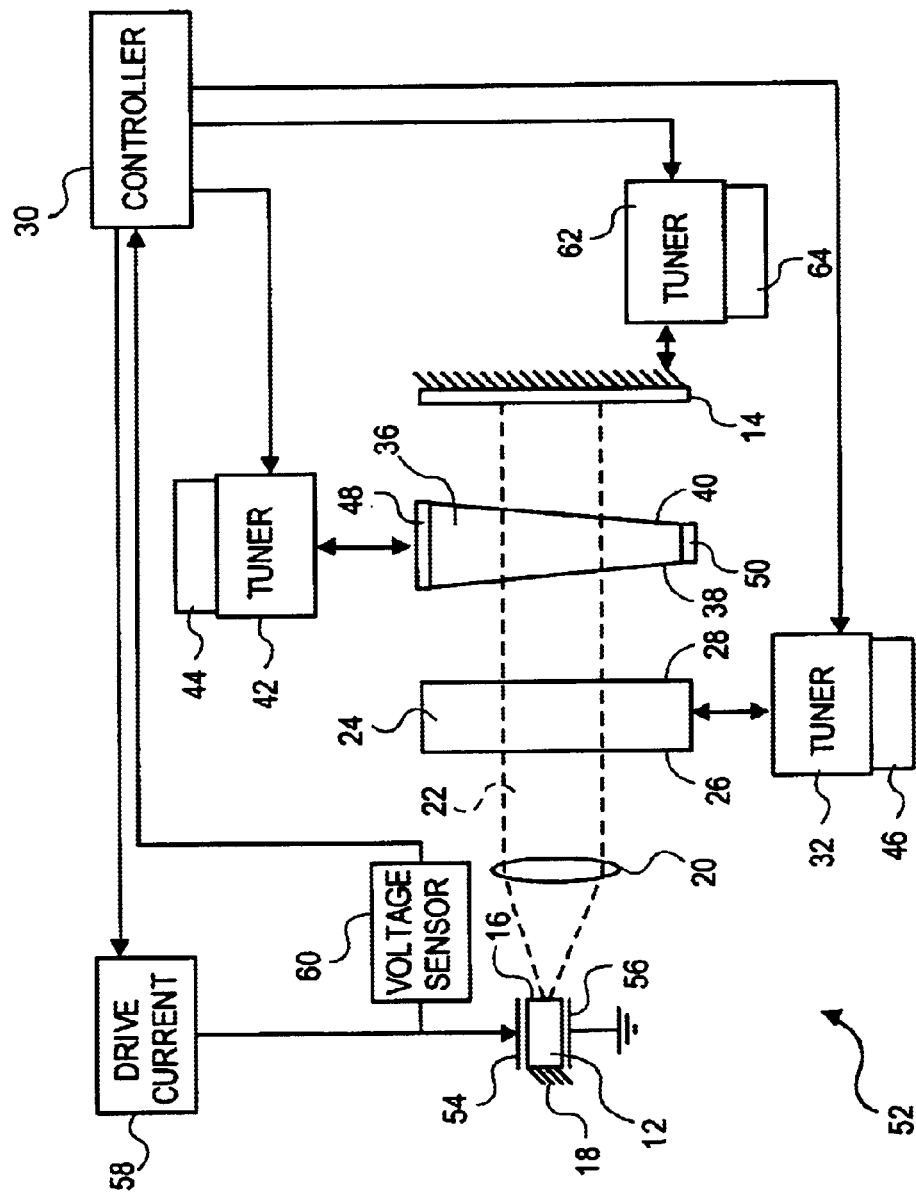
FIG. 7 is a schematic diagram of another embodiment external cavity laser apparatus with a tunable grid generator.

Referring now to FIG. 7, there is shown another embodiment of an external cavity laser apparatus 52 in accordance with the invention, wherein like reference numbers denote like parts. In the apparatus 52, gain medium 12 is shown with electrodes 54, 56 positioned configured to apply a current across gain medium 12 from drive current source 58. Drive current source 58 may be operatively coupled to controller 30 to allow selective control of the level of current across gain medium 12. A voltage sensor is operatively coupled to one of the electrodes 54, 56 and is configured to monitor the voltage modulation across gain medium 12 during laser operation. Voltage sensor 60 is operatively coupled to controller 30 as well.

An external cavity tuner element 62 is operatively coupled to controller 30 and to end mirror 14. Tuner 62 may comprise, for example, a stepper motor or other linear actuator device configured to position end mirror 14 to control the optical cavity or path length between end mirror 14 and output facet 18 of gain medium 12. An encoder 64 may be included in association with external cavity tuner 62 to ensure accurate positional adjustment of end mirror 14. A separate controller (not shown) may alternatively be used to control external cavity tuner 62.

In certain embodiments, external cavity tuner 62 may comprise a thermally tunable compensator element (not shown) that is configured to position end mirror 14 by heating or cooling the thermal compensator element according to optical cavity adjustment signals from controller 30 to a thermoelectric controller (also not shown) coupled to the thermally tunable compensator element. The use of a thermally controlled tuning element to positionally adjust an end mirror and other optical components in an external cavity laser is also described in U.S. patent application Ser. No. 09/814,646 to inventor Andrew Daiber, filed on Mar. 21, 2001, and in U.S. patent application Ser. No. 09/900,443 entitled "Laser Apparatus with Active Thermal Tuning of External Cavity" to inventors Mark Rice et al., co-filed simultaneously herewith, the disclosures of which are incorporated herein by reference.

The external cavity optical path length of laser 52 may also be tuned by positional adjustment of gain medium 12 such that output facet 18 is moved relative to end mirror 14. External cavity adjustment may also be achieved by voltage control of an electro-optic element (not shown) present in the external cavity and optically coupled to the external cavity, which can have its effective optical thickness, and hence the external cavity optical path length, controlled by selective application of voltage across the electro-optic element. The use of an electro-optic element for external cavity tuning is also described in U.S. patent application Ser. No. 09/900,426 entitled "Evaluation and Adjustment of Laser Losses According to Voltage Across Gain Medium" to inventors Daiber et al., simultaneously co-filed herewith and incorporated herein by reference.

In the operation of external cavity laser 52, the voltage across gain medium 12 is monitored by voltage sensor 60 and is communicated to controller 30. Since optical feedback from grid etalon 24, wedge etalon 36 and end mirror is introduced into gain medium through output facet 16, optical losses associated with grid etalon 24, wedge etalon 36 and end mirror are detectable in the voltage across gain medium 12 as monitored by sensor 60. When losses occur, an error signal is derived from the sensed voltage by controller 30, which will send corresponding compensatory signals to grid generator tuner 32, wedge etalon tuner 42 and/or external cavity tuner 14 as required to adjust grid etalon 24, wedge etalon 36 or end mirror 14 to null the error signal.

In certain embodiments, a signal modulation in the form of a frequency dither is introduced into the external cavity of laser 52 by a dither element (not shown) coupled to end mirror 14 or otherwise associated with the external cavity of laser 52. The signal modulation may comprise, for example, a frequency modulation of about 20 KHz, and may be created by a piezoelectric, electro-optic or acousto-optic device suitably couple to end mirror 14. Modulation of the optical path length of the laser external cavity in this manner produces intensity variations in the output power of external cavity laser 62 which are detectable by voltage sensor 60 due to optical feedback into gain medium 12 from the external cavity. These intensity variations will vary in magnitude and phase error according to alignment of an external cavity mode with the center wavelength of the passbands defined by wedge etalon 36 and grid generator 24. In other words, the intensity variations and phase shift in the modulation signal provide an effective way to evaluate external cavity losses and develop corresponding error signals for the adjustment of external cavity optical path length. Thus, controller 30 would derive error signals from the modulation introduced by the frequency dither, and communicate compensation signals to controller 30, which would correspondingly instruct external cavity tuner 62 to adjust the external cavity by positioning end mirror 14. The use of intensity variation and phase error in the modulated signal with respect to error signal determination and external cavity adjustment is also described in U.S. patent application Ser. No. 09/900,426 entitled "Evaluation and Adjustment of Laser Losses According to Voltage Across Gain Medium" to inventors Daiber et al., noted above and incorporated herein by reference.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. An external cavity laser apparatus, comprising:
    a gain medium having first and second output facets, said gain medium having an active region to emit a beam from said first output facet along an optical path;
    a reflector positioned in said optical path, said reflector and said second output facet defining an external cavity;
    a grid etalon positioned in said optical path; and
    a grid etalon tuner operatively coupled to said grid etalon and configured to adjust said grid etalon from a first communication grid to a second communication grid during operation of the external cavity laser, each of the first and second communication grids defining a plurality of transmission bands that are spaced apart according to the free spectral range of the grid etalon.

2. The apparatus of claim 1, wherein said grid etalon tuner is configured to rotatably adjust said grid etalon in said optical path.

3. The apparatus of claim 1, further comprising:
    a channel selector positioned in said optical path; and
    a channel selector tuner operatively coupled to said channel selector and configured to tune said channel selector to a transmission band of the plurality of transmission bands.

4. The apparatus of claim 1, further comprising an external cavity optical path length tuner operatively coupled to said external cavity and configured to adjust an optical path length for said external cavity.

5. The apparatus of claim 1, wherein said grid etalon is made of an electro-optic material having a voltage-dependent refractive index and said grid generator tuner is controllable to supply a selectable voltage to the grid etalon to effectuate grid generator tuning by changing the refractive index of the grid etalon.

6. The apparatus of claim 1, further comprising a controller, operatively coupled to the grid etalon tuner, to control the grid etalon tuner.

7. A method for generating a tunable coherent optical output, comprising:
    providing an external cavity laser including a gain medium with first and second output facets and an active region;
    emitting a coherent beam from said active region out of said first output facet along an optical path, and an end mirror positioned in said optical path, said end mirror and said second output facet defining an external cavity;
    positioning a grid etalon in association with said optical path; and
    changing said grid etalon from a first selectable communication grid to a second selectable communication grid during operation of the external cavity laser, each of said first and second selectable communication grids defining a plurality of wavelength passbands that are spaced apart according to the free spectral range of the grid etalon.

8. The method of claim 7, further comprising tuning a channel selector positioned in association with said optical path, said channel selector to produce a tunable transmission peak via which channel selection is effectuated by aligning the tunable transmission peak with a wavelength passband of the plurality of wavelength passbands.

9. The method of claim 7, wherein said changing comprises rotationally adjusting said grid etalon.

10. The method of claim 7, further comprising adjusting an optical path length for said external cavity.

11. An apparatus, comprising:
   a gain medium including an active region and having a first and second output facets, the gain medium to emit a coherent beam from the active region out of the first output facet along an optical path;
   an end mirror disposed opposite the first output facet of the gain medium, the end mirror and the second output facet defining an external laser cavity;
   a grid generator positioned in the optical path,
   a grid generator tuner operatively coupled to said grid generator to adjust said grid generator from a first communication grid to a second communication grid during operation of the apparatus, each of said first and second communication grids defining a plurality of wavelength passbands having a constant wavelength spacing according to channel spacing defined by each selectable communication grid; and
   a controller coupled to the grid generator tuner to provide a signal to the grid generator tuner to adjust the grid generator from the first communication grid to the second communication grid.

12. The apparatus of claim 11, wherein the grid generator comprises a grid etalon, and the grid generator tuner tunes the grid generator by rotating the grid generator.

13. The apparatus of claim 11, further comprising a drive current source coupled to the gain medium and the controller, the drive current source to selectively control the level of current supplied to the gain medium.

14. The apparatus of claim 13, further comprising a voltage sensor coupled to the gain medium and the controller, the voltage sensor to provide a voltage feedback signal to the controller corresponding to a voltage differential across the gain medium.

15. The apparatus of claim 11, further comprising a channel selector operatively coupled to the controller, the channel selector to align a transmission peak produced by the channel selector with a wavelength passband of the plurality of wavelength passbands.

16. The apparatus of claim 15, wherein the channel selector is a wedge etalon.

17. The apparatus of claim 16, wherein the wedge etalon is tuned by adjusting a position of the wedge etalon in the optical path.

18. The apparatus of claim 11, further comprising an external cavity tuner coupled to the end mirror and the controller, the external cavity tuner to position the end mirror to adjust the optical path length between the end mirror and the gain medium.

19. The apparatus of claim 18, wherein the external cavity tuner comprises a linear actuator device.

20. The apparatus of claim 19, wherein the external cavity tuner comprises a thermally tunable compensator element.

21. The apparatus of claim 11, further comprising a dither element to generate a modulation in an output characteristic of the laser detectable to produce a feedback signal for tuning the laser.

* * * * *